United States Patent [19]

Ishikawa et al.

[11] Patent Number: 5,243,142
[45] Date of Patent: Sep. 7, 1993

[54] PRINTED WIRING BOARD AND PROCESS FOR PRODUCING THE SAME

[75] Inventors: Kazumitsu Ishikawa, Hiratsuka; Haruo Suzuki; Shoji Oikawa, both of Odawara, all of Japan

[73] Assignee: Hitachi Aic Inc., Tokyo, Japan

[21] Appl. No.: 735,836

[22] Filed: Jul. 25, 1991

[30] Foreign Application Priority Data

Aug. 3, 1990 [JP] Japan ................................ 2-205043
May 17, 1991 [JP] Japan ................................ 3-140615

[51] Int. Cl.⁵ ............................................. H05K 1/00
[52] U.S. Cl. ................................... 174/262; 174/258; 174/266
[58] Field of Search ............... 174/262, 264; 498/901; 361/397

[56] References Cited

U.S. PATENT DOCUMENTS

| | | |
|---|---|---|
| 4,006,479 | 2/1977 | LaCombe . |
| 4,317,856 | 3/1982 | Huthwelker et al. ............... 428/901 |
| 4,383,363 | 5/1983 | Hayakawa et al. ................. 174/250 |
| 4,967,314 | 10/1990 | Higgins, III . |

FOREIGN PATENT DOCUMENTS

| | | |
|---|---|---|
| 3639443A1 | 5/1988 | Fed. Rep. of Germany . |
| 62-108594 | 5/1987 | Japan . |
| 64-24491 | 1/1989 | Japan . |
| 1-89779 | 6/1989 | Japan . |
| 1-143292 | 6/1989 | Japan . |

OTHER PUBLICATIONS

C. J. McDermott, *Face Protection of Printed Circuit Boards*, IBM Technical Disclosure Bulletin, vol. 11, No. 7, Dec. 1968, p. 733.

*Primary Examiner*—Leo P. Picard
*Assistant Examiner*—Cheryl R. Figlin
*Attorney, Agent, or Firm*—Antonelli, Terry, Stout & Kraus

[57] ABSTRACT

A printed wiring board obtained by filling a non-electroconductive resin paste containing a metal powder in inner wall metallized through holes of double sided copper-clad insulating substrate, followed by curing by two steps, can mount leadless parts in high mounting density without losing a function of electroconnecting wiring layers.

7 Claims, 2 Drawing Sheets

PRINTED WIRING BOARD AND PROCESS FOR PRODUCING THE SAME

BACKGROUND OF THE INVENTION

This invention relates to a printed wiring board having a special through hole structure suitable for mounting leadless parts. More particularly, the present invention relates to a printed wiring board for mounting leadless parts to provide hybrid IC suitable for highly densified mounting.

With recent progress of technology, parts to be mounted on multi-layer printed wiring boards are reduced in size more and more, and the mounting density of parts becomes higher and higher so as to apply the substrate area at maximum. In order to meet such a requirement, Japanese Utility Model Unexamined Publication No. HI-89779 proposes a multi-layer printed wiring board obtained by laminating an outer layer plate or plates having through holes inner walls of which are plated on one side or both sides of an inner layer plate via prepregs, said through holes being filled with the resin desired from said prepregs to form blind via holes, on which pads for mounting parts are formed. But there are problems in such a structure in that a gas is generated by the heat at the time of soldering parts, spaces are formed between the filled resin and the pads, and the air in such spaces is expanded by the heat to cause misregistration of soldered positions, and the like. On the other hand, there are proposed to fill inner wall metallized through holes of printed wiring boards with solder (Japanese Patent Unexamined Publication Nos. 62-108594, and HI-24491). According to such solder filling processes, there are various problems in that it is very difficult to fill through holes with solder, much care should be taken to handle high-temperature molten solder, various troubles are accompanied to remove solder adhered to unnecessary portions, flying of lead powder produced by polishing the solder is not preferable for health, and the like. In contrast, Japanese Patent Unexamined Publication No. HI-43292 discloses a process for producing a printed wiring board comprising drilling holes in a double-sided copper-clad insulating substrate, filling the holes with an electroconductive paste such as a mixture of a thermosetting resin as a base and a copper paste, or the like, and curing the electroconductive paste by irradiation with electron beams. But since the holes have no electroconductive films on inner walls of the wholes, electric resistance changes easily and thus is unstable, resulting in expecting no stable electric connection. Further, since the electroconductive paste is cured by irradiation with electron beams, there arises a problem of excess curing.

SUMMARY OF THE INVENTION

It is an object of the present invention to provide a printed wiring board capable of mounting leadless parts by applying the function of through holes for electrically connecting wiring layers and capable of enhancing mounting density of parts overcoming the above-mentioned defects of prior art, and a process for producing such a printed wiring board.

The present invention provides a printed wiring board comprising a double-sides copper-clad insulating substrate, said insulating substrate having through holes at desired portions, an electroconductive plating layer being formed on inner walls of through holes and both surfaces of insulating substrate, inner portions of said through holes being filled with a cured product of non-electroconductive resin paste containing a metal powder, at least both surfaces of said cured product being covered with a second plating layer, and said second plating layer being subjected to circuit formation treatment.

The present invention also provides a printed wiring board wherein the circuit formation treatment is carried out by using a dry film method.

The present invention further provides a process for producing such printed wiring boards.

DESCRIPTION OF THE PREFERRED EMBODIMENTS

Figure 1:
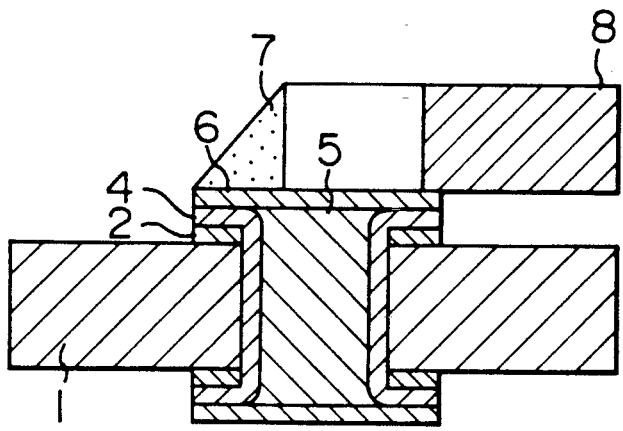
FIG. 1 is a cross-sectional view showing one embodiment of the printed wiring board of the present invention.
Figure 4:
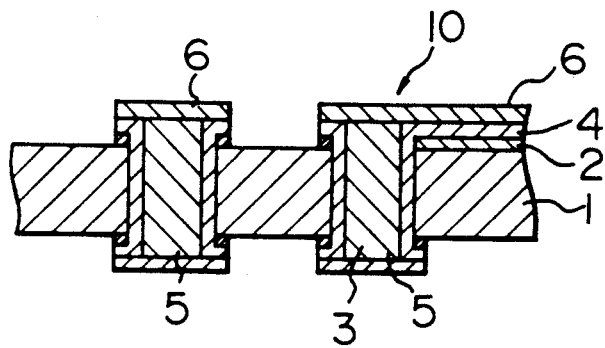
FIG. 4 is a cross-sectional view showing another embodiment of the printed wiring board of the present invention.

The printed wiring board of the present invention comprises, as shown in FIG. 1, a double-sided copper (2)-clad insulating substrate (1), said insulating substrate having through holes (3) at desired portions, an electroconductive plating layer (4) being formed on inner walls of through holes and both surfaces of insulating substrate, inner portions of said through holes being filled with a cured product (5) of non-electroconductive resin paste containing a metal powder, both surfaces of said cured product being covered with a second plating layer (6), and said second plating layer being subjected to circuit formation treatment (e.g. a leadless part (8) being mounted on the second plating layer (6) using solder (7) as shown in FIG. 4).

Figure 2:
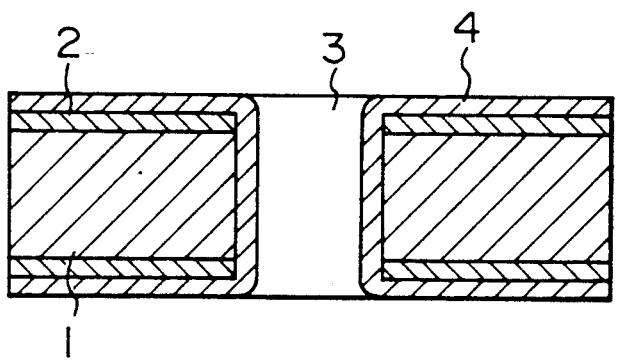
FIGS. 2 and 3 are cross-sectional views explaining a process for producing the printed wiring board of FIG. 1.
Figure 3:
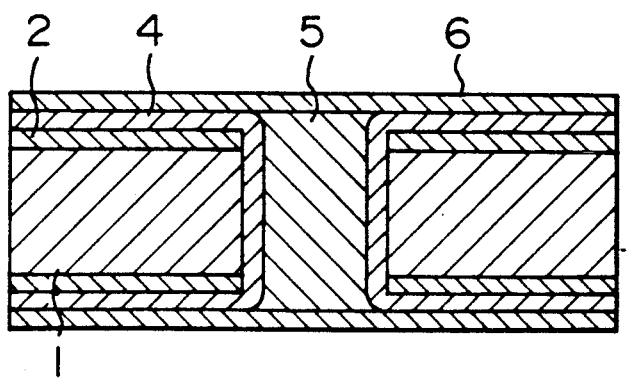

Such a printed wiring board can be produced as shown partly in FIGS. 2 and 3.

First, an insulating substrate (1) having copper foils (2) on both surfaces thereof is used. As the insulating substrate (1), glass-epoxy resin, paper impregnated with a phenol resin, an epoxy resin on the like, and the like conventionally used insulating substrates. It is also possible to use polytetrafluoroethylene, polyimides, etc.

The insulating substrate (1) is drilled or punched to form through holes (3) at desired portions.

Inner walls of through holes and surfaces of the insulating substrate continued therefrom are subjected to through hole plating to form an electroconductive plating layer (4) (FIG. 2). Processing of the insulating substrate including through hole plating can be carried by a subtractive process or an additive process. The plating can be carried out either electroless copper plating or electric copper plating.

Then, inner portions of through holes (3) are filled with a non-electroconductive resin paste containing a metal powder. As the metal powder, there can be used a copper powder, a nickel powder, a silver powder, a palladium powder, a gold powder, etc. or a mixture thereof, so as not to increase electroconductivity. As the resin for forming the resin paste, there can be used thermosetting resins such as an epoxy resin, a phenol resin, a melamine resin, a polyester resin, a polyurethane resin, a vinyl resin, etc. Among them, the use of a novolak type epoxy resin, and a bisphenol type epoxy resin is preferable from the viewpoint of heat resistance and adhesiveness. The content of the metal powder in the resin paste is preferably in the range of not showing electroconductivity, e.g. about 50 to 90% by weight, although such values are changed depending on the kind of metal powder used. When the content of metal powder is less than 50% by weight, deposition of electroless plating is deteriorated. On the other hand, when the content is more than 90% by weight, adhesiveness between the resin and the metal powder is influenced badly and electroconductivity appears undesirably. It is preferable to use the metal powder having a diameter of 0.3 to 10 μm. In the present invention, since the thermosetting resin is used as the resin for forming the resin paste, there is no fear of excess curing in the case of applying curing by electron beams. Further, the resin paste containing a metal powder shows specific volume resistivity of $1 \times 10^9 \Omega \cdot cm$ or more compared with specific volume resistivity of $1 \times 10 \Omega \cdot cm$ or less of ordinary electroconductive resin pastes. This means that the resin paste is non-electroconductive. In addition, since the resin paste contains a metal powder, the adhesiveness to the second plating layer (6) is remarkably improved.

Filling of through holes with the resin paste containing a metal powder can be carried out by a printing method, a dipping method, a casting method, etc. When through holes are selected and filled with the resin paste, the use of the printing method and the casting method is preferable. On the other hand, when whole through holes are filled with the resin paste, the use of the dipping method is preferable.

The resin paste filling the through holes is preliminarily dried at a temperature of 100° C. or less, preferably 70° to 100° C. The resin paste should fill the through holes flat to some extent. When the resin paste overflows from through holes, the excess portions are removed by buffing or pressed flat using a pair of stainless plates.

Then the resin paste in the through holes is cured with heating at 120° to 160° C., preferably 140° to 150° C. to give a cured product (5).

In the present invention, since the resin paste is cured by two steps, i.e. at 100° C. or less in the first step and at 120° to 160° C. in the second step, generation of undesirable bubbles can be prevented. But, even if bubbles are generated in the filled resin paste to form voids, no undesirable bad influence due to the formation of voids appears due to showing non-electroconductivity of the cured resin paste containing a metal powder.

Then, a second plating layer (6) is formed on both surfaces of cured product (5) (FIG. 3). The second plating layer can be formed by using copper, a copper alloy, nickel, solder, or the like material having solderability by electroless plating or a combination of electroless plating and electroplating.

The second plating layer (6) is when subjected to circuit formation treatment by a conventional method, or a so-called dry film method.

After forming the circuit, leadless parts (8) are mounted using solder (7).

In the case of soldering leadless parts on through holes which are unnecessary for mounting parts, it is difficult to fill the through holes with a filling material flat after completion of printed wiring board and it is not suitable for mass production. Thus, it is necessary to fill through holes with a filling material during the production of printed wiring board using a material having good solderability and to make the surfaces of the filled material flat. According to the present invention, since the resin paste containing a metal powder is filled in the through holes and the surfaces of the filled resin paste are made flat by buffing or pressing, followed by forming a second plating layer having good solderability on both sides of the filled resin paste, leadless parts can be mounted with very high density without changing known mounting method and soldering method of leadless parts due to good solderability.

On the other hand, the circuit formation can be carried out by a so-called dry film method including an etching step as follows.

On a second plating layer (6), a dry film layer is formed thereon and a circuit pattern is formed, followed by etching treatment to form a circuit.

According to a known method, an etching resist layer has a function of protecting through hole plating from an etching solution. But when a land copper foil area around a through hole is made small in order to enhance a pattern density, the necessary area of dry film becomes small, resulting in becoming unable to bear a shower pressure of etching solution used in the etching step, allowing penetration of the etching solution into the through holes, and peeling of the second plating layer.

But, in the present invention, since the inner wall metallized through holes are filled with the cured product of resin paste containing a metal powder, the film strength of dry film is enhanced and the disadvantages of the prior art process are overcome.

In the above, the explanation is made as to the use of a single plate of double-sided copper-clad insulating substrate, but the present invention can be applied to a multi-layer printed circuit board obtained by laminating a plurality of such insulating substrates.

The present invention is illustrated by way of the following Examples.

Example 1

A printed wiring board of FIG. 1 was produced as follows. A glass-epoxy laminate (1) having a copper foil (2) of 18 μm thick on both sides thereof was subjected to drilling of through holes (3) at desired portions. Then, through hole plating was carried out on inner walls of the through holes and both surfaces of the laminate by electroless copper plating and electric copper plating to form an electroconductive plating layer (4) (FIG. 2). Then, a resin paste containing about 85% by weight of copper powder having a diameter of 5 to 10 μm and about 15% by weight of an epoxy resin was filled in through holes using a squeezee (a spatula for pushing an ink off through a screen) and a metal mask, followed by preliminarily drying at about 80° C. Then, upper and lower surfaces of the resin paste were pressed at 10 kg/cm² using a pair of stainless steel plates to increase the packing density of the resin paste. Unnecessary resin paste on upper portions of through holes was removed by #320 belt buffing and flattened. Curing of the resin paste was carried out at 150° C. in a dryer. Then, a copper plating layer (6) of 15 μm thick was formed on both surfaces the cured resin paste (5) by electroless plating (FIG. 3). Then, an etching mask having a desired pattern was formed by a conventional photographic method, followed by etching according to a conventional method to form a flat, high density pattern on the whole surface, particularly on the filled through hole portions. Then, a solder resist film was formed on the whole surface except for a soldering land by a printing method, followed by coating with a preflux.

Then, on the resulting substrate, a solder (7) cream was print coated on only the land portions, and a chip part (8) was mounted, followed by soldering using an infrared reflow furnace to obtain the desired hybrid IC substrate having high density and high reliability. FIG. 1 is a cross-sectional view of the resulting printed wiring board soldering a leadless part on the through hole portion.

As mentioned above, according to the present invention, leadless parts can be soldered on upper portions of through holes which are unnecessary for high density mounting according to a known method. Thus, there can be obtained a highly integrated hybrid IC wiring board having about 1.2 to 1.5 times as high in integration.

Example 2

Figure 5:
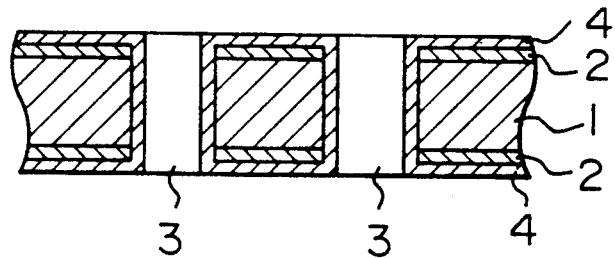
FIGS. 5 and 6 are cross-sectional views explaining a process for producing the printed wiring board of FIG. 4.

Holes (3) were drilled in desired portions of a double-sided copper (2)-clad glass-epoxy resin insulating substrate (1) of 18 μm thick, followed by formation of an electroconductive plating layer (4) comprising 0.3 μm of electroless plated copper layer and 20 μm of electric plated copper layer on the inner walls of through holes and both surfaces of the insulating substrate (FIG. 5).

Figure 6:
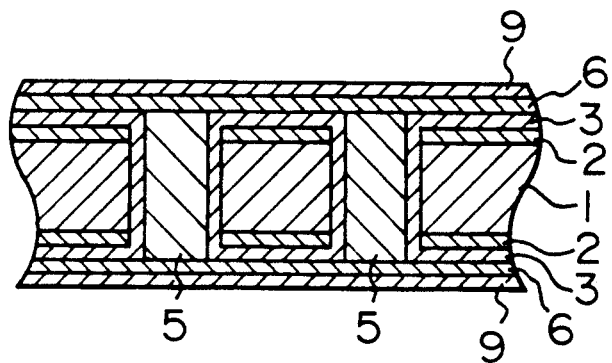

Then, the through holes (3) were filled with a resin paste comprising a copper powder having a particle size of 0.3 to 10 μm and an epoxy resin (90:10 in weight ratio) by a screen printing method, followed by drying at 90° C. Both surfaces of the resulting resin paste were polished with a sand paper and flattened. Then, a second plating layer (6) comprising 0.2 μm in thickness by electroless plating and 10 μm in thickness by electroplating was formed on the whole surfaces of the insulating substrate. Then, a dry film layer (9) was formed on the second plating layer (6) by thermal pressing using an aqueous solution of dry film 3620 type (mfd. by E.I. du Pont de nemours & Co., Inc.) (FIG. 6).

On the dry film layer (9), a negative film of conductor pattern was placed by a conventional method and exposed to ultraviolet light imagewise, followed by backing. Development was carried out using an aqueous solution of 2% sodium carbonate to remove unnecessary dry film as a circuit. Then, an etching solution of cupric chloride was showed to remove exposed and retained copper layers 4 and 6, followed by removal of the dry film layer (9) by a 3% sodium hydroxide solution to give a printed wiring board (10) having through holes (3) filled with the cured resin paste containing a metal powder (5) (FIG. 4).

Compared with a printed wiring board produced by not filling through holes with the resin paste, the level of defectiveness of the printed wiring board (10) of the present invention through the production process is lowered to ⅓. When leadless parts are mounted the printed wiring board of the present invention, no blister nor peeling of the second plating layer takes place, resulting in improving through hole reliability.

As mentioned above, by employing the dry film method, defectiveness of through holes during the etching step is reduced remarkably. Thus, multi-layer printed wiring boards can be produced easily without defects. Further, since the land copper foil can be reduced, there can be produced printed wiring boards with high density mounting.

What is claimed is:

1. A printed wiring board comprising a double-sided copper-clad insulating subtrate, said insulating substrate having through holes at desired portions, an electroconductive plating layer being formed on inner walls of through holes and both surfaces of insulating substrate, inner portions of said through holes being filled with a cured product of non-electroconductive resin paste containing a metal powder, at least both surfaces of cured product being covered with a second plating layer for mounting parts, and said second layer being subjected to circuit formation treatment.

2. A printed wiring board according to claim 1, wherein said second plating layer is provided in a circuit pattern by said circuit formation treatment and wherein the circuit formation treatment is carried out by using a dry film layer and etching treatment.

3. A printed wiring board according to claim 1, wherein the non-electroconductive resin paste is a paste of a thermosetting resin containing a powder of at least one metal selected from the group consisting of copper, nickel, silver, palladium and gold.

4. A printed wiring board according to claim 3, wherein the resin of non-electroconductive resin paste is a phenol resin or an epoxy resin.

5. A printed wiring board according to claim 3, wherein the powder is contained in an amount of 50 to 90% by weight of said non-electroconductive resin paste.

6. A printed wiring board according to claim 1, further comprising a leadless part mounted on said second plating layer.

7. A printed wiring board according to claim 6, wherein said leadless part is mounted on the second plating layer over a respective through hole.

* * * * *